(12) United States Patent
Shinohara (10) Patent No.: US 7,394,492 B2
(45) Date of Patent: Jul. 1, 2008

(54) SOLID STATE IMAGE PICKUP DEVICE, METHOD OF DRIVING SOLID STATE IMAGE PICKUP DEVICE, AND CAMERA USING THE SOLID STATE IMAGE PICKUP DEVICE

(75) Inventor: Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 635 days.

(21) Appl. No.: 10/991,392

(22) Filed: Nov. 19, 2004

(65) Prior Publication Data

US 2005/0121519 A1    Jun. 9, 2005

(30) Foreign Application Priority Data

Dec. 5, 2003  (JP) .............. 2003-408030
Sep. 30, 2004 (JP) .............. 2004-287569

(51) Int. Cl.
H04N 3/14    (2006.01)
H04N 5/335   (2006.01)
H01L 27/00   (2006.01)

(52) U.S. Cl. .................. 348/301; 348/308; 348/610; 250/208.1

(58) Field of Classification Search ................ 348/294, 348/300, 308; 250/208.1
See application file for complete search history.

(56) References Cited

U.S. PATENT DOCUMENTS

| 5,296,696 A | * | 3/1994 | Uno ................. 250/208.1 |
| 5,471,515 A | | 11/1995 | Fossum et al. ............ 377/60 |
| 5,933,189 A | | 8/1999 | Nomura |
| 5,942,774 A | | 8/1999 | Isogai et al. |
| 6,091,793 A | | 7/2000 | Kamashita |
| 6,661,459 B1 | | 12/2003 | Koizumi et al. ............ 348/310 |
| 6,727,946 B1 | * | 4/2004 | Zhao et al. ............ 348/308 |

(Continued)

FOREIGN PATENT DOCUMENTS

JP     08-251488     9/1996

(Continued)

OTHER PUBLICATIONS

Fossum, E., "Active-pixel sensors challenge CCDs," Technology Guide: Detector Handbook, Laser Focus World, Jun. 1993, pp. 83-87, Pasadena, CA.

(Continued)

Primary Examiner—Ngoc-Yen T. Vu
Assistant Examiner—Chia-Wei A Chen
(74) Attorney, Agent, or Firm—Fitzpatrick, Cella, Harper & Scinto (57) ABSTRACT

Provided is an amplification type solid state image pickup device capable of increasing a saturation charge amount even when an increase in circuit scale is suppressed. In a pixel of the amplification type solid state image pickup device, a power source voltage is supplied to a signal output line to change a potential of the signal output line at transfer operation that a signal charge accumulated in a photo diode is transferred to a gate of an amplification transistor. Then, a potential of an FD portion which is capacitively coupled to the signal output line and used for supplying the signal charge to the gate of the amplification transistor increases, so that the saturation charge amount can be set to a large value.

6 Claims, 9 Drawing Sheets

U.S. PATENT DOCUMENTS

| | | |
|---|---|---|
| 6,940,551 B2 * | 9/2005 | Merrill ................. 348/301 |
| 6,946,636 B2 | 9/2005 | Eguchi et al. |
| 6,963,372 B1 | 11/2005 | Hiyama et al. |
| 7,081,607 B1 | 7/2006 | Koizumi |
| 7,119,840 B2 | 10/2006 | Mabuchi |
| 7,187,410 B2 | 3/2007 | Yamaguchi et al. |
| 2001/0005224 A1 * | 6/2001 | Lee ........................ 348/294 |
| 2002/0051229 A1 | 5/2002 | Eguchi et al. ............. 358/445 |
| 2003/0164443 A1 * | 9/2003 | Henderson ............. 250/208.1 |
| 2003/0214595 A1 * | 11/2003 | Mabuchi ................. 348/294 |
| 2004/0017496 A1 | 1/2004 | Koizumi et al. ........... 348/308 |
| 2004/0036789 A1 | 2/2004 | Shinohara ................. 348/308 |
| 2005/0057389 A1 * | 3/2005 | Krymski ................... 341/169 |
| 2006/0001751 A1 | 1/2006 | Abe et al. |

FOREIGN PATENT DOCUMENTS

| | | |
|---|---|---|
| JP | 08-251489 | 9/1996 |
| JP | 08-293591 | 11/1996 |
| JP | 09-247536 | 9/1997 |
| JP | 09-252434 A | 9/1997 |
| JP | 11-177076 | 7/1999 |
| JP | 11-274454 A | 10/1999 |
| JP | 11-308531 | 11/1999 |
| JP | 2000-077642 A | 3/2000 |
| JP | 2001-177765 A | 6/2001 |
| JP | 2001-320630 A | 11/2001 |
| JP | 2002-354343 A | 12/2002 |
| JP | 2003-023144 A | 1/2003 |
| JP | 2003-046864 A | 2/2003 |
| JP | 2003-087662 A | 3/2003 |
| JP | 2004-172950 A | 6/2004 |

OTHER PUBLICATIONS

Mendis, S. et al., "Progress in CMOS Active Pixel Image Sensors," SPIE vol. 2172, (1994) Center for Space Microelectronics Tech., Jet Propulsion Laboratory, California Institute of Technology, pp. 19-29, paper presented at a Conference on Feb. 7-8, 1994 in San Jose, CA.

Dickinson, A. et al., "TP 13.5: A 256x256 CMOS Active Pixel Image Sensor with Motion Detection," pp. 226-227, 1995 IEEE International Solid-State Circuits Conf., Pasadena, CA., Feb. 16, 1995.

Nixon, R. et al., "256x256 CMOS Active Pixel Sensor Camera-on-a-Chip," ISSCC96/Session/Electronic Imaging Circuits/Paper FA11.1/1996 IEEE International Solid-State Circuits Conference, pp. 178-179.

* cited by examiner

SOLID STATE IMAGE PICKUP DEVICE, METHOD OF DRIVING SOLID STATE IMAGE PICKUP DEVICE, AND CAMERA USING THE SOLID STATE IMAGE PICKUP DEVICE

BACKGROUND OF THE INVENTION

1. Field of the Invention

The present invention relates to a solid state image pickup device, a method of driving the solid state image pickup device, and a camera using the solid state image pickup device. In particular, the present invention is suitable for use in an amplification type solid state image pickup device such as a CMOS sensor.

2. Related Background Art

Up to now, a large number of charge coupled devices (CCDs) have been used as solid state image pickup devices because of its high S/N ratio. However, a so-called amplification type solid state image pickup device (solid state image pickup device of charge transfer signal amplification type) has been also developed because of low power consumption and good ease of use.

In the amplification type solid state image pickup device, a signal charge accumulated in a photo diode by incident light is led to the control electrode of a transistor in a pixel. An amplified output corresponding to the signal charge is supplied from the main electrode of the transistor. In particular, efforts have been put into developing a complementary MOS (CMOS) sensor using a metal oxide semiconductor (MOS) transistor. This is because the CMOS sensor matches with a CMOS process well and a driving circuit and a signal processing circuit which are used for the CMOS sensor can be formed on a chip.

Figure 6:
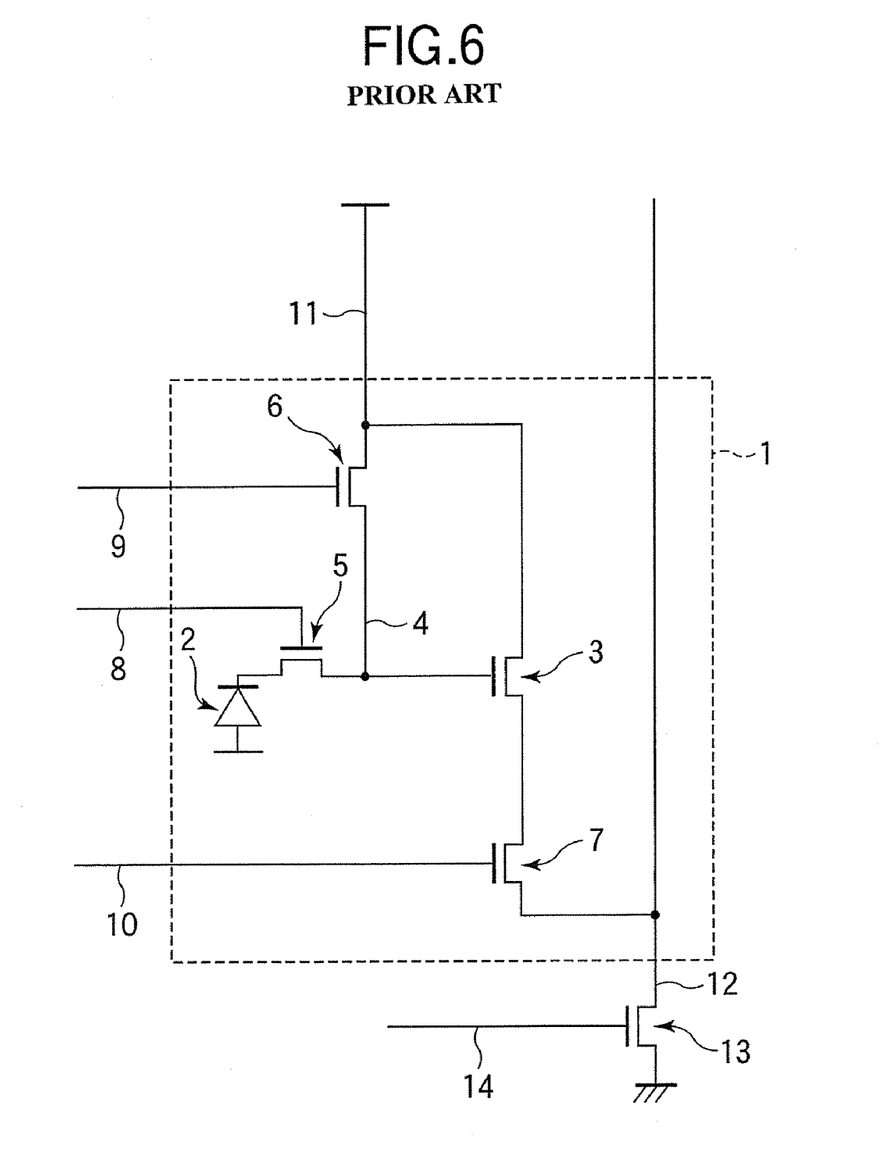
FIG. 6 is a circuit diagram showing a conventional CMOS sensor pixel.

FIG. 6 is a circuit diagram showing a conventional CMOS sensor pixel which is described in JP H11-274454 A related to Japanese Patent.

In FIG. 6, reference numeral 1 denotes a unit pixel. Reference numeral 2 denotes a photo diode that accumulates a signal charge generated by incident light. Reference numeral 3 denotes an amplification MOS transistor that outputs an amplified signal corresponding to the signal charge supplied from the photo diode 2. Reference numeral 4 denotes a floating diffusion portion (hereinafter also referred to as a "FD portion") for receiving the signal charge and supplying the received signal charge to the gate electrode of the amplification MOS transistor 3. Reference numeral 5 denotes a transfer MOS transistor for transferring the signal charge accumulated in the photo diode 2 to the FD portion 4. Reference numeral 6 denotes a reset MOS transistor for resetting the FD portion 4. Reference numeral 7 denotes a selection MOS transistor for selecting an output pixel.

Reference numeral 8 denotes a control line for applying a pulse to the transfer gate of the transfer MOS transistor 5 to control charge transfer operation. Reference numeral 9 denotes a control line for applying a pulse to the reset gate of the reset MOS transistor 6 to control reset operation. Reference numeral 10 denotes a control line for applying a pulse to the gate of the selection MOS transistor 7 to control selection operation. Reference numeral 11 denotes a power source wiring which is connected with the drain of the amplification MOS transistor 3 and the drain of the reset MOS transistor 6 and used to supply a power source potential to the drain of the amplification MOS transistor 3 and the drain of the reset MOS transistor 6.

Reference numeral 12 denotes a signal output line to which an amplified signal of a selected pixel 1 is outputted. Reference numeral 13 denotes a MOS transistor which serves as a constant current source and composes a source follower with the amplification MOS transistor 3. Reference numeral 14 denotes a wiring for supplying a potential for operating the MOS transistor 13 at a constant current to the gate electrode of the MOS transistor 13.

Figure 7:
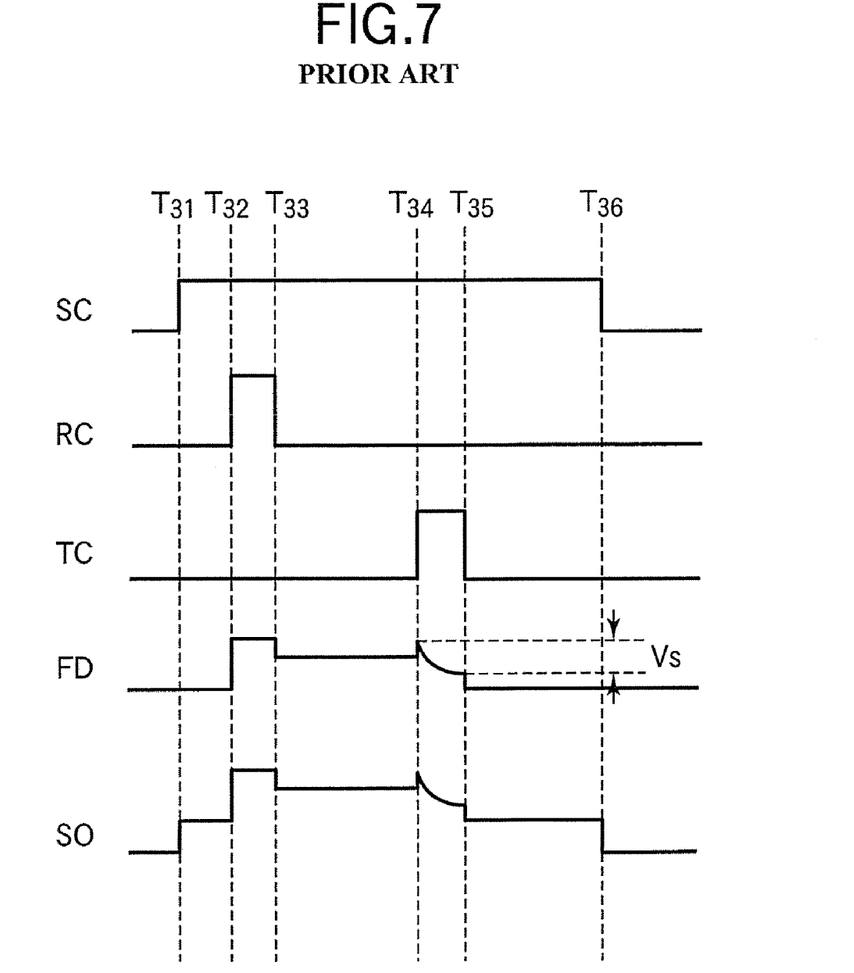
FIG. 7 is a timing chart explaining operation of the CMOS sensor pixel shown in FIG. 6.

FIG. 7 is a timing chart showing the operation of the CMOS sensor pixel shown in FIG. 6. In FIG. 7, SC denotes a drive pulse signal applied to the MOS transistor 7 through the control line 10, RC denotes a drive pulse signal applied to the MOS transistor 6 through the control line 9, and TC denotes a drive pulse signal applied to the MOS transistor 5 through the control line 8. FD and SO indicate a potential of the FD portion 4 and a potential of the signal output line 12, respectively. Assume that each of the MOS transistors shown in FIG. 6 is an N-channel MOS transistor. When a gate potential of a MOS transistor is at a high level ("H"), the MOS transistor becomes an on-state. When a gate potential of a MOS transistor is at a low level ("L"), the MOS transistor becomes an off-state.

First, assume that each of the signals SC, RC, and TC is in an "L" state. When the signal SC is set to "H" at a time T31 to subject the selection MOS transistor 7 to an on-state, the pixel 1 from which a signal is read is selected. Next, when the signal RC is set to "H" at a time T32 (and then is changed to "L" at a time T33) to subject the reset MOS transistor 6 to an on-state, the FD portion 4 is reset. An output potential corresponding to a reset potential is produced on the signal output line 12 because the amplification MOS transistor 3 and the constant current MOS transistor 13 compose the source follower.

Next, when the signal TC becomes "H" at a time T34 (and then is changed to "L" at a time T35), the transfer MOS transistor 5 becomes an on-state. As a result, the signal charge accumulated in the photo diode 2 is transferred to the FD portion 4. Then, the potential FD of the FD portion 4 is changed by a voltage Vs corresponding to the signal charge. The change in potential is also caused on the signal output line 12, so that the potential SO of the signal output line 12 changes. After that, the signal SC is set to "L" at a time T36, so that the selection MOS transistor 7 becomes an off-state.

Here, the reset potential produced on the signal output line 12 includes noises such as a variation in threshold voltage of the amplification MOS transistor 3 and a reset noise generated when the FD portion 4 is reset. However, the photo diode 2 is totally depleted after the transfer of the signal charge is completed, with the result that no charge is left in the photo diode 2. Thus, the change in potential (voltage) Vs corresponding to the signal charge includes no noises.

In a two-dimensional CMOS sensor, a readout circuit (not shown) for removing the reset noise and taking only a signal is connected with the signal output line 12. With respect to the readout circuit, there have been proposed various circuits such as a readout circuit that removes the noise using a clamp circuit and a readout circuit that separately holds the noise and a mixed component (the noise and a pure signal) and leads the noise and the mixed component to a differential amplifier of a final stage at readout of horizontal scanning to remove the noise. The detailed description is omitted here.

A saturation charge amount in the conventional CMOS sensor pixel is determined by a limit that the photo diode 2 can be totally depleted after the transfer of the signal charge. At the time of the completion of transfer of the signal charge, (at the time T35 in FIG. 7) in the drive pulse signal TC for transfer, the minimum channel potential of the transfer MOS transistor 5 required to totally deplete the photo diode 2 is assumed to be Vd.

When a signal charge amount is large, the channel potential of the transfer MOS transistor 5 at the time of the completion of transfer of the signal charge is equal to the potential FD of the FD portion 4. Therefore, when a reset potential of the FD portion 4 is given by Vrs, a complete signal transfer condition is expressed by (Vrs−Vs)>Vd. Correctly, when a reset pulse (see RC in FIG. 7) and a transfer pulse (see TC in FIG. 7) are applied, the potential FD of the FD portion 4 is varied by a parasitic capacitor between the reset gate and the FD portion 4 and a parasitic capacitor between the transfer gate and the FD portion 4. Here, the variation in potential FD is omitted.

When the signal potential FD of the FD portion 4 corresponding to a saturation signal is given by Vsat, a condition for completely transferring a saturation signal charge is expressed by (Vrs−Vsat)>Vd. When a saturation charge amount of the photo diode 2 increases, Vd and Vsat necessarily become higher. Therefore, the saturation charge amount of the photo diode 2 can be increased only up to a limit satisfying the condition for completely transferring the saturation signal charge.

Increasing the reset potential Vrs of the FD portion 4 becomes an essential condition for increasing the saturation charge amount. However, an upper limit of the reset potential Vrs is a value obtained by subtracting the threshold voltage of the reset MOS transistor 6 from a high level potential of the reset pulse. In general, a high level of the pulse signal corresponds to a power source voltage of the sensor. Therefore, a limit value of the saturation charge amount depends on the power source voltage of the sensor and is determined based on the power source voltage of the sensor. Thus, it has been difficult to widen a dynamic range.

In order to solve such a problem, JP 2000-209508 A related to Japanese Patent has proposed a method of setting the reset potential of the FD portion 4 to a higher potential by increasing a high level potential of the reset pulse using a step-up circuit. However, when the step-up circuit is incorporated in the sensor chip, a circuit scale increases and the reliability of the chip is deteriorated by a large voltage applied to the circuit. Thus, it is necessary to solve the problem with a simple method.

SUMMARY OF THE INVENTION

The present invention has been made in view of the above-mentioned circumstances. An object of the present invention is to increase a saturation charge amount in an amplification type solid state image pickup device without an increase in circuit scale.

According to one aspect of the present invention, there is provided a solid state image pickup device, including an arrangement of a plurality of unit pixels, each of which includes a photo diode for accumulating a signal charge generated by incident light, an amplification transistor whose control electrode receives the signal charge from the photo diode and which outputs an amplification signal corresponding to the signal charge to a signal output line, a reset transistor for resetting the control electrode of the amplification transistor, and a transfer transistor for transferring the signal charge accumulated in the photo diode to the control electrode of the amplification transistor, in which a predetermined potential is supplied to the signal output line at transfer operation for transferring the signal charge accumulated in the photo diode to the control electrode of the amplification transistor.

According to another aspect of the present invention, there is provided a solid state image pickup device, including an arrangement of a plurality of unit pixels, each of which includes a photo diode for accumulating a signal charge generated by incident light, an amplification transistor whose control electrode receives the signal charge from the photo diode and which outputs an amplification signal corresponding to the signal charge to a signal output line, a reset transistor for resetting the control electrode of the amplification transistor, and a transfer transistor for transferring the signal charge accumulated in the photo diode to the control electrode of the amplification transistor, in which a voltage which is to be supplied to a power source supply terminal of the amplification transistor at the reset operation for resetting the control electrode of the amplification transistor is different from a potential which is to be supplied to the power source supply terminal of the amplification transistor at the transfer operation for transferring the signal charge accumulated in the photo diode to the control electrode of the amplification transistor.

According to still another aspect of the present invention, there is provided a method of driving a solid state image pickup device including an arrangement of a plurality of unit pixels, each of which includes a photo diode for accumulating a signal charge generated by incident light, an amplification transistor whose control electrode receives the signal charge from the photo diode and which outputs an amplification signal corresponding to the signal charge to a signal output line, a reset transistor for resetting the control electrode of the amplification transistor, and a transfer transistor for transferring the signal charge accumulated in the photo diode to the control electrode of the amplification transistor, the method including: setting a potential different from the signal output line at a predetermined potential at transfer operation for transferring the signal charge accumulated in the photo diode to the control electrode of the amplification transistor.

According to further another aspect of the present invention, there is provided a method of driving a solid state image pickup device including an arrangement of a plurality of unit pixels, each of which includes a photo diode for accumulating a signal charge generated by incident light, an amplification transistor whose control electrode receives the signal charge from the photo diode and which outputs an amplification signal corresponding to the signal charge to a signal output line, a reset transistor for resetting the control electrode of the amplification transistor, and a transfer transistor for transferring the signal charge accumulated in the photo diode to the control electrode of the amplification transistor, the method including: setting a first potential to be supplied to a power source supply terminal of the amplification transistor at reset operation for resetting the control electrode of the amplification transistor; and setting a second potential different from the first potential, which is to be supplied to the power source supply terminal of the amplification transistor at transfer operation for transferring the signal charge accumulated in the photo diode to the control electrode of the amplification transistor.

According to the present invention, the potential of the signal output line is set to a high potential at the time of transfer operation when the signal charge accumulated in the photo diode is transferred to the control electrode of the amplification transistor. Therefore, it is possible to increase a potential of a node which is capacitively coupled to the signal output line and connected with the control electrode of the amplification transistor.

According to the present invention, the potential of the signal output line is set to a high potential at the time of transfer operation when the signal charge accumulated in the photo diode is transferred to the control electrode of the amplification transistor. Therefore, it is possible to increase a potential of a node which is capacitively coupled to the signal output line and connected with the control electrode of the amplification transistor and to set a limit value of a saturation charge to a value higher than a conventional limit value. Thus, when only a simple circuit is added, a higher saturation voltage can be obtained and a dynamic range can be widened.

DESCRIPTION OF THE PREFERRED EMBODIMENTS

Hereinafter, embodiments of the present invention will be described with reference to the accompanying drawings.

First Embodiment

Figure 1:
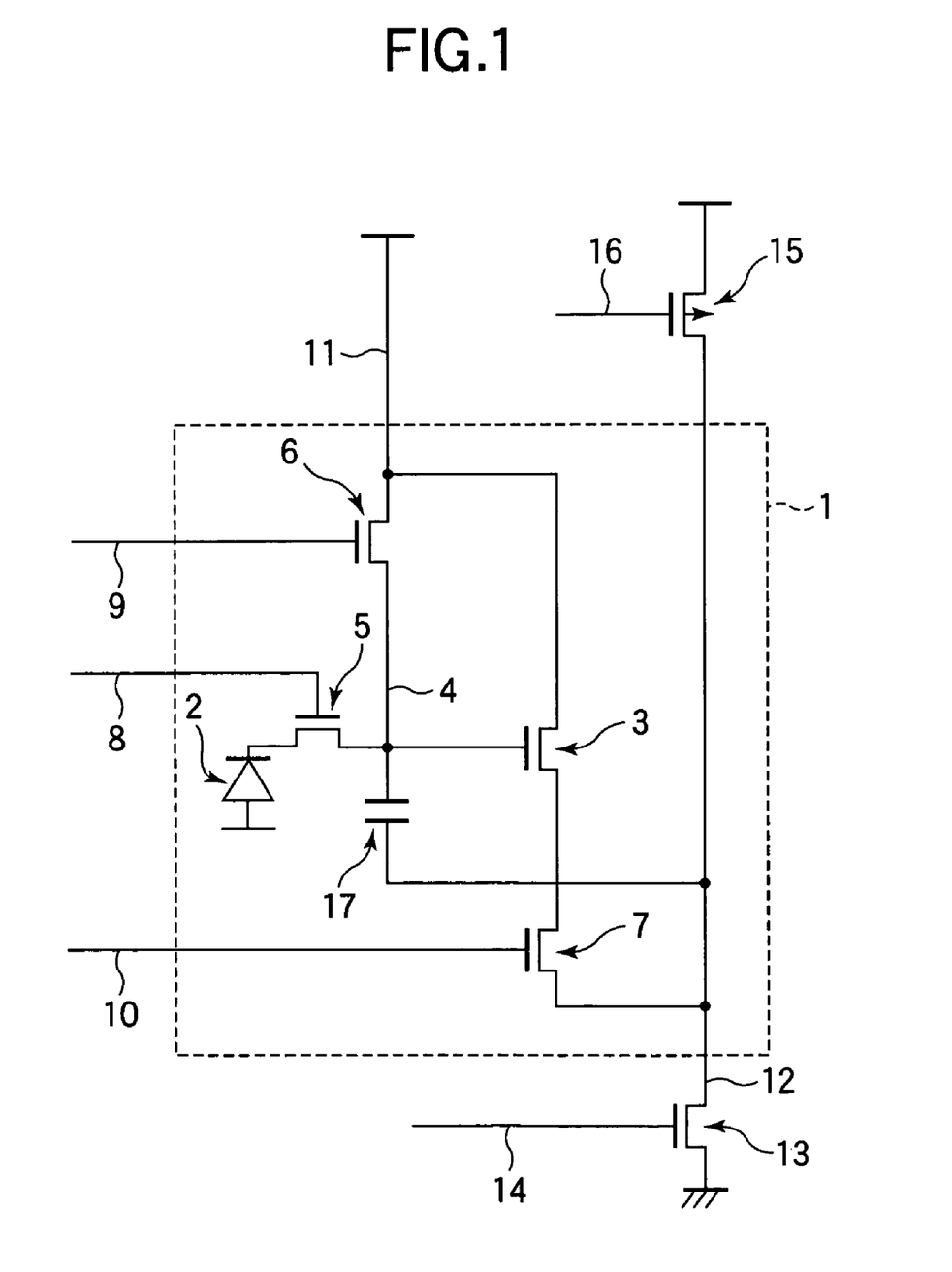
FIG. 1 is a circuit diagram showing an example of a pixel of a solid state image pickup device according to a first embodiment of the present invention.

FIG. 1 is an equivalent circuit diagram showing an example of a pixel of a solid state image pickup device according to a first embodiment of the present invention.

In FIG. 1, a unit pixel 1 includes a photo diode 2, an amplification MOS transistor 3, a transfer MOS transistor 5, a reset MOS transistor 6, a selection MOS transistor 7, and a capacitor 17. The unit pixel 1 further includes a floating diffusion portion (FD portion) 4.

The photo diode 2 accumulates a signal charge generated by incident light. The amplification MOS transistor 3 outputs an amplification signal corresponding to the signal charge supplied from the photo diode 2 through the transfer MOS transistor 5 and the FD portion 4. The FD portion 4 is provided for receiving the signal charge from the photo diode 2 and supplying the received signal charge to the gate electrode of the amplification MOS transistor 3.

The transfer MOS transistor 5 is provided for transferring the signal charge accumulated in the photo diode 2 to the FD portion 4. The reset MOS transistor 6 is provided for resetting the FD portion 4. The selection MOS transistor 7 is provided for selecting an output pixel. One electrode of the capacitor 17 is connected with the FD portion 4 and the other electrode thereof is connected with a signal output line 12. That is, the FD portion 4 and the signal output line 12 are capacitively coupled to each other. The capacitor 17 may be a capacitor which is intentionally formed for incorporation or may be a parasitic capacitor.

The gate of the transfer MOS transistor 5, the gate of the reset MOS transistor 6, and the gate of the selection MOS transistor 7 are connected with control lines 8, 9, and 10, respectively. The control line 8 applies a signal (pulse) to the gate of the transfer MOS transistor 5 to control charge transfer operation. The control line 9 applies a signal (pulse) to the gate of the reset MOS transistor 6 to control reset operation. The control line 10 applies a signal (pulse) to the gate of the selection MOS transistor 7 to control selection operation.

A power source wiring 11 is connected with the drain of the amplification MOS transistor 3 and the drain of the reset MOS transistor 6 and used to supply a power source potential to the drain of the amplification MOS transistor 3 and the drain of the reset MOS transistor 6. An amplification signal of a selected pixel 1 is outputted to the signal output line 12. A MOS transistor 13 serves as a constant current source and composes a source follower with the amplification MOS transistor 3. The gate of the MOS transistor 13 is connected with a wiring 14 for supplying a potential for operating the MOS transistor 13 at a constant current to the gate thereof.

The gate of a P-channel MOS transistor 15 is connected with a control line 16. The drain and source of the P-channel MOS transistor 15 are connected with the signal output line 12 and the power source wiring 11, respectively. The control line 16 applies a signal (pulse) to the gate of the P-channel MOS transistor 15 to control a potential of the signal output line 12.

Figure 2:
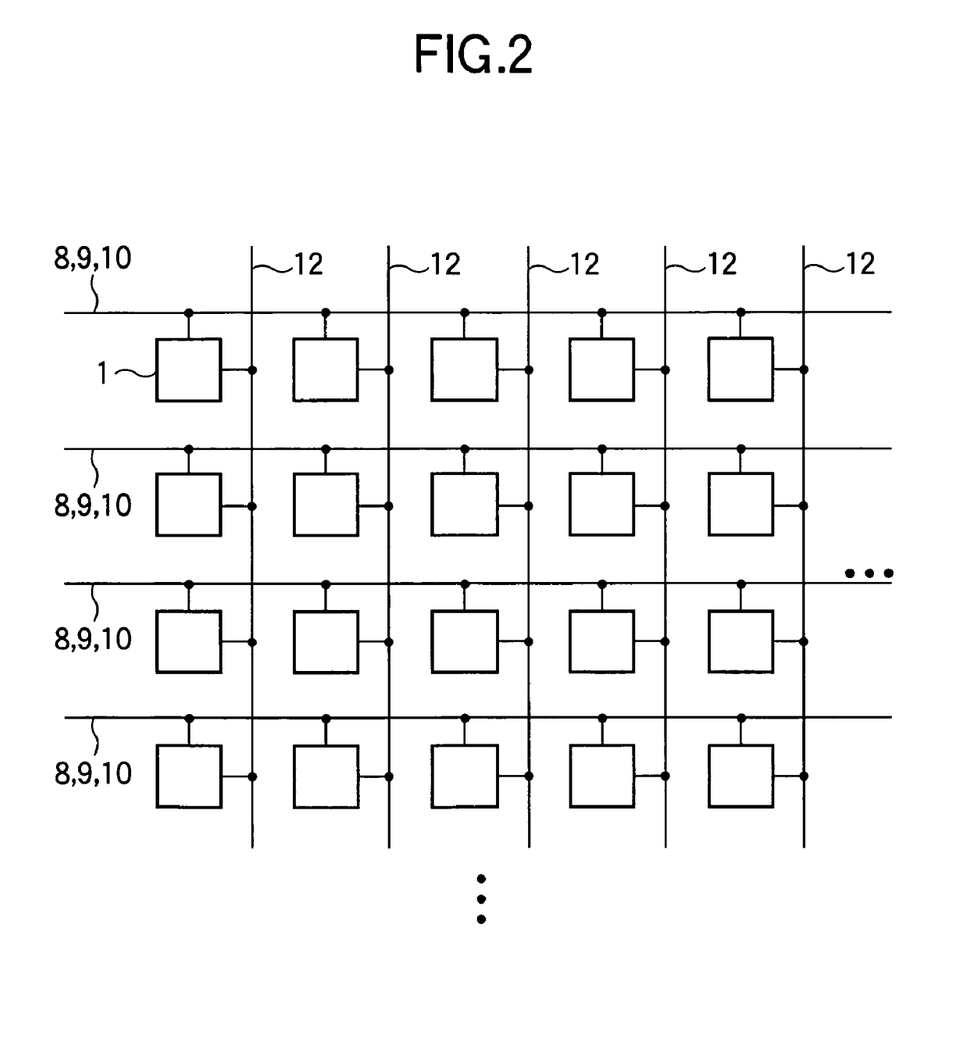
FIG. 2 is a diagram showing an example of the solid state image pickup device according to the first embodiment.

As shown in FIG. 2, a plurality of unit pixels 1, each of which is formed as shown in FIG. 1, are arranged in two-dimensional matrix to produce a pixel region of a two-dimensional solid state image pickup device. In such a matrix arrangement, as shown in FIG. 1, the signal output line 12 is commonly connected with the pixels 1 composing a column. Each of the control lines 8, 9, and 10 is commonly connected with the pixels 1 composing a row. According to such an arrangement, only output signals from the pixels 1 composing a row selected through the control line 10 are outputted to the signal output line 12.

Next, the operation of the pixel shown in FIG. 1 will be described.

Figure 3:
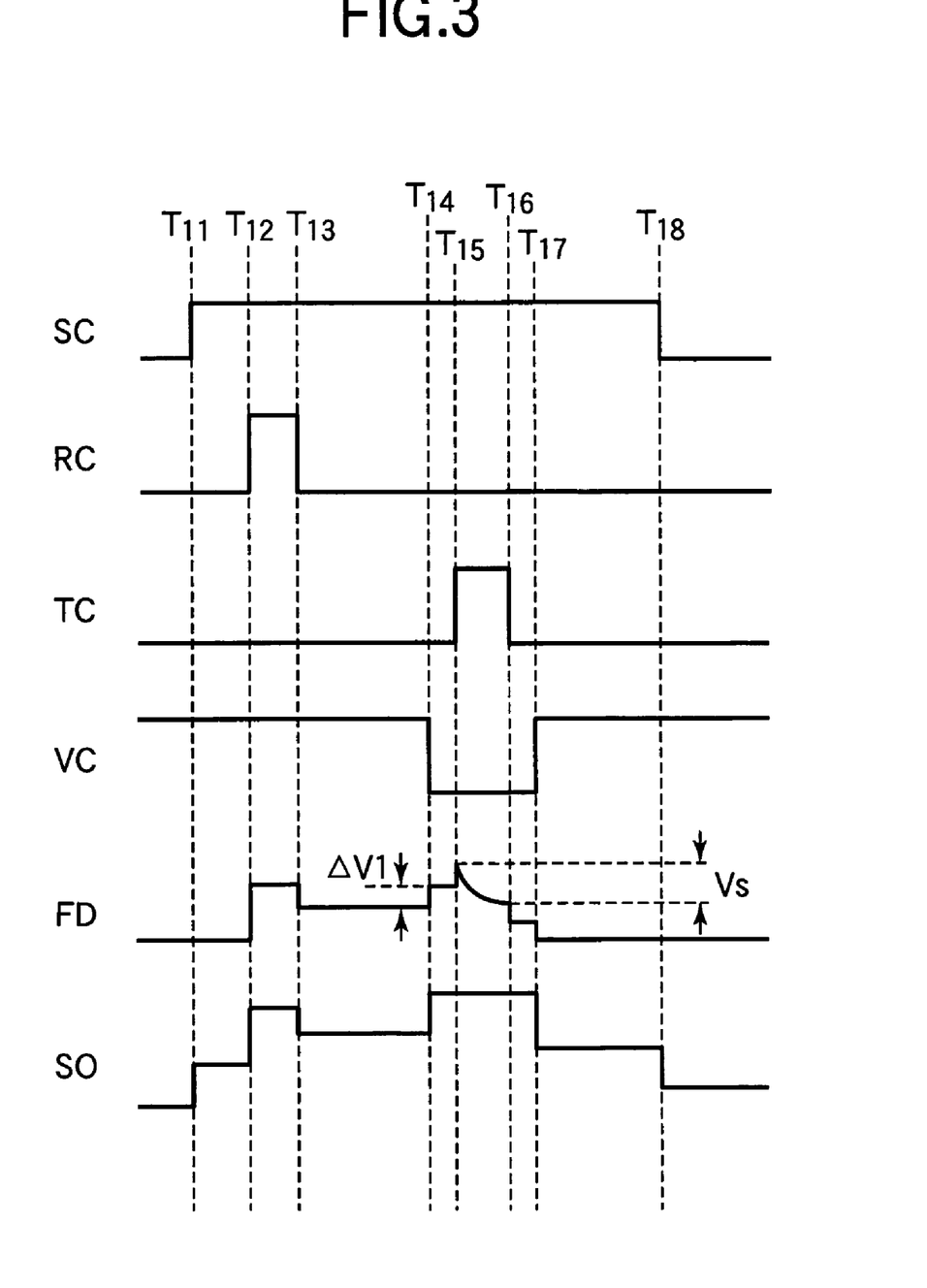
FIG. 3 is a timing chart explaining operation of the pixel shown in FIG. 1.

FIG. 3 is a timing chart explaining the operation of the pixel shown in FIG. 1.

In FIG. 3, SC denotes a drive pulse signal applied to the MOS transistor 7 through the control line 10, RC denotes a drive pulse signal applied to the MOS transistor 6 through the control line 9, TC denotes a drive pulse signal applied to the MOS transistor 5 through the control line 8, and VC denotes a drive pulse signal applied to the MOS transistor 15 through the control line 16. FD and SO indicate a potential of FD portion 4 and a potential of the signal output line 12, respectively. Assume that each of the MOS transistors 7, 6, and 5 shown in FIG. 1 is an N-channel MOS transistor. When a gate potential of a MOS transistor is "H", the MOS transistor becomes an on-state. When a gate potential of a MOS transistor is "L", the MOS transistor becomes an off-state. With respect to the P-channel MOS transistor 15, when a gate voltage of a MOS transistor is "H", the MOS transistor becomes an off-state. When a gate voltage of a MOS transistor is "L", the MOS transistor becomes an on-state.

When each of the signals SC, RC, and TC is in an "L" state and the signal VC is in an "H" state, that is, when each of the MOS transistors 7, 6, 5, and 15 is in an off-state, the signal SC is set to "H" at a time T11 to subject the selection MOS transistor 7 to an on-state. Then, the pixel 1 from which a signal is read is selected.

Next, the signal RC is set to "H" at a time T12. The signal RC is set to "L" at a time T13 after a lapse of predetermined time. When the signal RC serves as an "H" pulse, the reset MOS transistor 6 becomes an on-state, with the result that the FD portion 4 is reset. At this time, the amplification MOS transistor 3 and the constant current MOS transistor 13 compose the source follower. Thus, the output potential corresponding to the reset potential is produced on the signal output line 12, so that the potential SO of the signal output line 12 changes.

Next, the signal VC is set to "L" at a time T14. Then, the P-channel MOS transistor 15 becomes an on-state. The potential SO of the signal output line 12 on which the output potential corresponding to the reset potential is being produced becomes the power source potential. With a change in potential SO of the signal output line 12, the potential FD of the FD portion 4 which is capacitively coupled to the signal output line 12 is increased by a voltage $\Delta V1$ by a capacitor produced between the signal output line 12 and the FD portion 4.

Next, the signal TC is set to "H" at a time T15 and set to "L" at a time T16 after a lapse of predetermined time. When the signal TC serves as an "H" pulse, the transfer MOS transistor 5 becomes an on-state, so that the signal charge accumulated in the photo diode 2 is transferred to the FD portion 4. Then, the potential FD of the FD portion 4 is changed by a voltage Vs corresponding to the signal charge. The change in potential is also caused on the signal output line 12, so that the potential SO of the signal output line 12 changes.

After that, the signal VC is set to "H" at a time T17 to subject the P-channel MOS transistor 15 to an off-state. Then, the signal SC is set to "L" at a time T18 to subject the selection MOS transistor 7 to an off-state.

As described above, according to the first embodiment, during a period for which the signal charge is transferred from the photo diode 2 to the FD portion 4, that is, during a period for which the signal TC supplied to the gate of the transfer MOS transistor 5 through the control line 8 is "H" (time T15 to time T16), the P-channel MOS transistor 15 is subjected to an on-state. Therefore, the potential SO of the signal output line 12 on which the output potential corresponding to the reset potential is being produced is subjected to the power source potential. With a change in potential of the signal output line 12, the potential FD of the FD portion 4 which is capacitively coupled to the signal output line 12 is increased by the voltage $\Delta V1$.

As a result, a condition for outputting a saturation voltage Vsat is expressed by $(Vrs-Vsat+\Delta V1)>Vd$. Therefore, Vd for determining a limit of the saturation voltage can be set to a value larger than a conventional value to obtain a larger saturation voltage. Thus, it is possible to provide a method of driving a CMOS solid state image pickup device in a wide dynamic range, so that a dynamic range can be widened as compared with a conventional CMOS solid state image pickup device.

Second Embodiment

Next, a second embodiment will be described.

Figure 4:
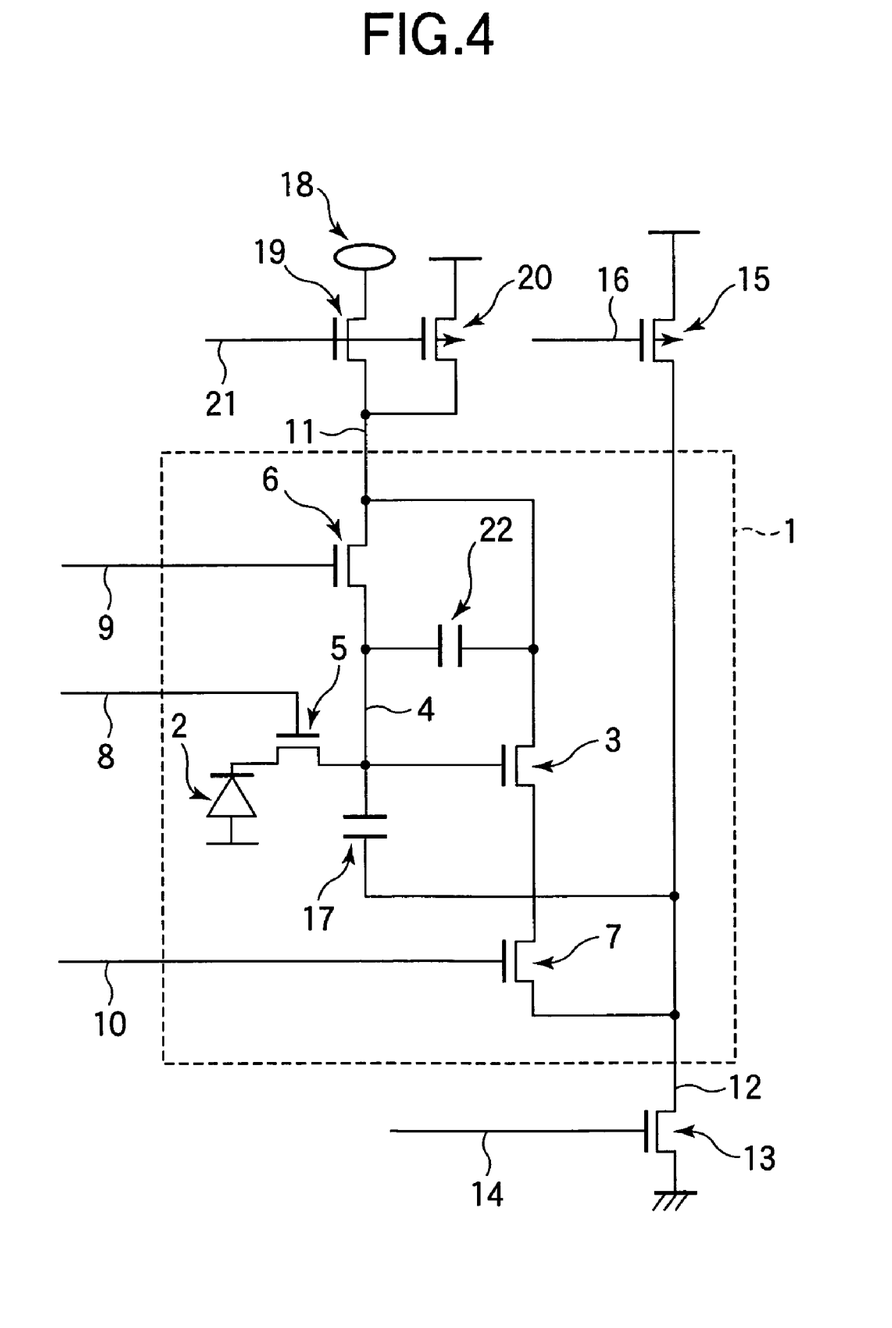
FIG. 4 is a circuit diagram showing an example of a pixel of a solid state image pickup device according to a second embodiment of the present invention.

FIG. 4 is an equivalent circuit diagram showing an example of a pixel of a solid state image pickup device according to a second embodiment of the present invention. In FIG. 4, the same reference numerals are provided for constituent elements having the same functions as those shown in FIG. 1 and the duplicated descriptions are omitted here.

In FIG. 4, reference numeral 18 denotes a terminal for supplying the reset potential Vrs of the FD portion 4. Reference numeral 19 denotes an N-channel MOS transistor for supplying the reset potential Vrs to the power source wiring 11. Reference numeral 20 denotes a P-channel MOS transistor for supplying the power source potential to the power source wiring 11. Reference numeral 21 denotes a common control line for the MOS transistors 19 and 20. In the pixel in the second embodiment, the MOS transistors 19 and 20 are controlled through the common control line 21. Therefore, the reset potential Vrs or the power source potential can be supplied to the power source wiring 11 by switching therebetween as appropriate.

A capacitor 22 is formed between the power source wiring 11 and the FD portion 4. One electrode of the capacitor 22 is connected with the power source wiring 11 and the other electrode thereof is connected with the FD portion 4. That is, the FD portion 4 and the power source wiring 11 are capacitively coupled to each other. The capacitor 22 may be a capacitor which is intentionally formed for incorporation or may be a parasitic capacitor.

A solid state image pickup device in which a plurality of unit pixels 1, each of which is formed as shown in FIG. 4, are arranged has the same arrangement as that in the first embodiment (see FIG. 2).

Next, the operation of the pixel shown in FIG. 4 will be described.

Figure 5:
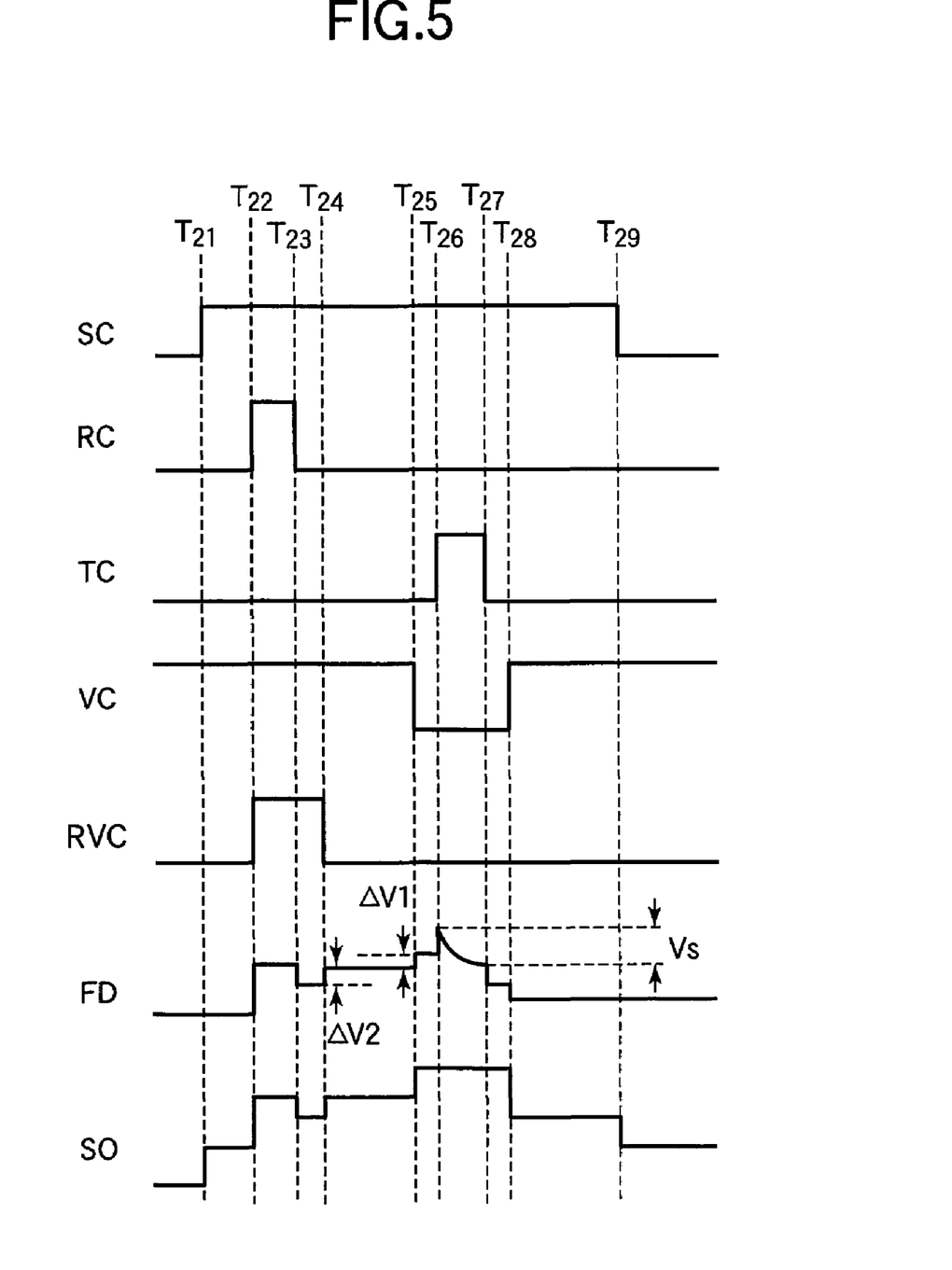
FIG. 5 is a timing chart explaining operation of the pixel shown in FIG. 4.

FIG. 5 is a timing chart explaining the operation of the pixel shown in FIG. 4.

In FIG. 5, SC denotes a drive pulse signal applied to the MOS transistor 7 through the control line 10, RC denotes a drive pulse signal applied to the MOS transistor 6 through the control line 9, and TC denotes a drive pulse signal applied to the MOS transistor 5 through the control line 8. VC denotes a drive pulse signal applied to the MOS transistor 15 through the control line 16 and RVC denotes a drive pulse signal applied to the MOS transistor 19 or 20 through the control line 21. FD and SO indicate a potential of FD portion 4 and a potential of the signal output line 12, respectively. Assume that each of the MOS transistors 7, 6, 5, and 19 shown in FIG. 4 is an N-channel MOS transistor. When a gate potential of a MOS transistor is "H", the MOS transistor becomes an on-state. When a gate potential of a MOS transistor is "L", the MOS transistor becomes an off-state. With respect to each of the P-channel MOS transistors 15 and 20, when a gate voltage of a MOS transistor is "H", the MOS transistor becomes an off-state. When a gate voltage of a MOS transistor is "L", the MOS transistor becomes an on-state.

When each of the signals SC, RC, TC and RVC is in an "L" state and the signal VC is in an "H" state, that is, when each of the MOS transistors 7, 6, 5, 15, and 19 is in an off-state and the MOS transistor 20 is in an on-state, the power source potential is supplied to the power source wiring 11. With this state, when the signal SC is set to "H" at a time T21 to subject the selection MOS transistor 7 to an on-state, the pixel 1 from which a signal is read is selected.

Next, each of the signals RC and RVC is set to "H" at a time T22. The signal RC is set to "L" at a time T23 after a lapse of predetermined time. When the signal RC serves as an "H" pulse, the reset MOS transistor 6 becomes an on-state, with the result that the FD portion 4 is reset. At this time, because the signal RVC is "H", the MOS transistor 19 is in an on-state and the MOS transistor 20 is in an off-state. Therefore, the reset potential Vrs is supplied to the power source wiring 11 through the terminal 18. The amplification MOS transistor 3 and the constant current MOS transistor 13 compose the source follower. Thus, the output potential corresponding to the reset potential is produced on the signal output line 12, so that the potential SO of the signal output line 12 changes.

After that, when the signal RVC is set to "L" at a time T24, the MOS transistor 19 becomes an off-state and the MOS transistor 20 becomes an on-state. Therefore, a potential supplied to the power source wiring 11 is switched from the reset potential Vrs to the power source potential. With a change in potential of the power source wiring 11, the potential FD of the FD portion 4 which is capacitively coupled to the power source wiring 11 is increased by a voltage ΔV2.

After that, the operation from a time T25 to a time T29 is identical to the operation from the time T14 to the time T18 as shown in FIG. 3 and thus the description is omitted here.

As described above, according to the second embodiment, in addition to the same drive as that in the first embodiment, during a period for which the FD portion 4 is reset, that is, during a period for which the signal RC supplied to the gate of the reset MOS transistor 6 through the control line 9 is "H" (time T22 to time T23), the MOS transistor 19 is subjected to an on-state and the MOS transistor 20 is subjected to an off-state. Therefore, the potential supplied to the power source wiring 11 is switched from the power source potential to the reset potential Vrs. After the completion of reset of the FD portion 4, the potential supplied to the power source wiring 11 is switched to the power source potential again. With a change in potential of the power source wiring 11 from the reset potential Vrs to the power source potential, the potential FD of the FD portion 4 which is capacitively coupled to the power source wiring 11 is increased by ΔV2.

When an effect obtained as in the first embodiment is also added, a condition for outputting the saturation voltage Vsat is expressed by (Vrs−Vsat+ΔV1+ΔV2)>Vd. Therefore, when the reset potential Vrs is set to a value obtained by subtracting the threshold voltage of the reset MOS transistor 6 from the power source potential, Vd for determining a limit of the saturation-voltage can be set to a value larger than that in the first embodiment to obtain a larger saturation voltage. Thus, it is possible to provide a method of driving a CMOS solid state image pickup device in a wider dynamic range, so that a dynamic range can be further widened as compared with that in the first embodiment.

In the second embodiment, in addition to the first embodiment, the power source potential or the reset potential Vrs is allowed to be supplied to the power source wiring 11 during the period for which the signal RC is "H" by switching therebetween. The power source potential or the reset potential Vrs may be allowed to be supplied to the power source wiring 11 during the period for which the signal RC is "H" by switching therebetween without considering the first embodiment. Even in such a case, the potential FD of the FD portion 4 which is capacitively coupled to the power source wiring 11 can be increased by ΔV2 based on a potential difference between the reset potential Vrs supplied during the reset of the FD portion 4 and the power source potential supplied after the completion of reset.

The pixels of the solid state image pickup devices described in the first and second embodiments are examples, and the present invention is not limited to those. For example, the polarity of the photo diode, the polarity of each of the MOS transistors, and the polarity of each of the signals (pulses) may be reversed.

In the first and second embodiments, the potential of the signal output line 12 which is set when the signal charge is transferred from the photo diode 2 to the FD portion 4 is set to the power source potential. The potential of the signal output line 12 may be a potential having a potential difference with respect to the reset potential in a direction reverse to a direction that the potential of the signal output line 12 is changed from the reset potential to the signal output potential. The potential of the power source wiring 11 which is set when the FD portion 4 is reset in the second embodiment may be also the potential having the potential difference with respect to the reset potential.

In the first and second embodiments, a MOS transistor is used as each of the transistors composing the pixel. However, another type of transistor such as a bipolar transistor or a junction type field effect transistor may be used.

Other Embodiments of the Present Invention

Next, an example in the case where the solid state image pickup device according to each of the embodiments is applied to a still video camera will be described.

Figure 8:
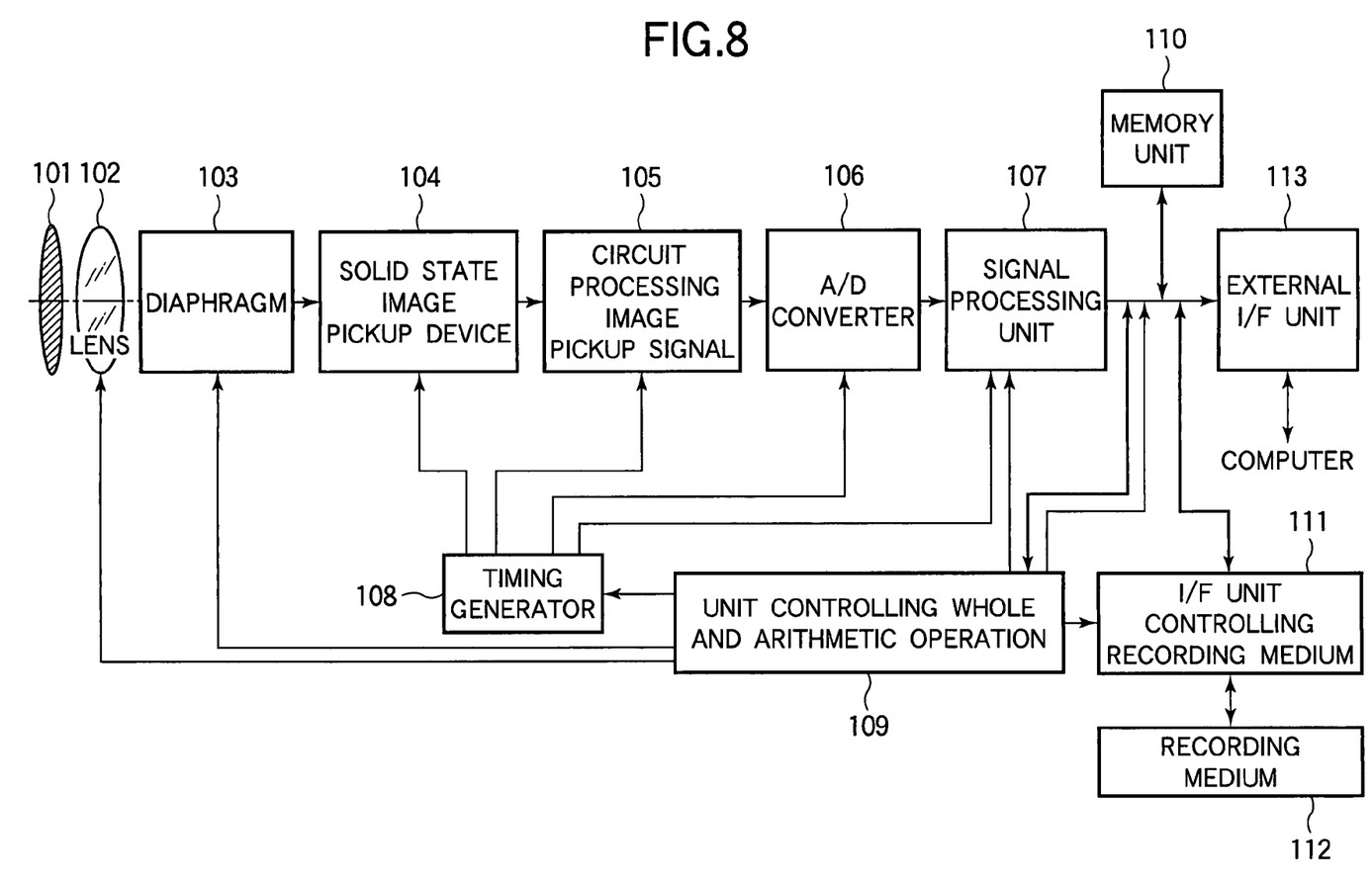
FIG. 8 is a block diagram showing an example in which the solid state image pickup device according to any embodiment of the present invention is applied to a still video camera.

FIG. 8 is a block diagram showing an example in which the solid state image pickup device according to each of the embodiments is applied to the still video camera.

In FIG. 8, the still video camera includes a barrier 101 that serves as a protector of a lens 102 and as a main switch, the lens 102 that forms an optical image of a subject onto a solid state image pickup device 104, a diaphragm 103 capable of changing the amount of light passing through the lens 102, and the solid state image pickup device 104 that takes in the optical image of the subject which is formed by the lens 102 as an image signal. The still video camera further includes an A/D converter 106 that performs analog-to-digital conversion on the image signal outputted from the solid state image pickup device 104, a signal processing unit 107 that performs various corrections on image data outputted from the A/D converter 106 and data compression, and a timing generator 108 that outputs various timing signals to the solid state image pickup device 104, an image pickup signal processing circuit 105, the A/D converter 106, and the signal processing unit 107. The still video camera further includes a whole and arithmetic operation controlling unit 109 that performs various arithmetic operation and controlling the whole still video camera, a memory unit 110 that temporarily stores the image data, an interface unit 111 that performs recording and read-out on a recording medium 112, and an interface unit 113 that communicates with an external computer and the like. The recording medium 112 such as a semiconductor memory for recording and reading out the image data is detachably attachable.

Next, the image taking operation of the still video camera having the above-mentioned structure will be described.

When the barrier 101 is opened, a main power source is turned on. Next, a power source for a control system is turned on and a power source for an image pickup system circuit including the A/D converter 106 is turned on.

After that, in order to control an exposure amount, the whole and arithmetic operation controlling unit 109 causes the diaphragm 103 to open. A signal outputted from the solid state image pickup device 104 is converted into digital data by the A/D converter 106 and then the digital data is inputted to the signal processing unit 107.

The arithmetic operation of exposure is performed based on the data by the whole and arithmetic operation controlling unit 109.

An intensity is determined from a result obtained by light measurement and the whole and arithmetic operation controlling unit 109 controls the diaphragm 103 based on the determination.

Next, a high frequency component is extracted from the signal outputted from the solid state image pickup device 104, and the arithmetic operation of a distance to the subject is performed by the whole and arithmetic operation controlling unit 109. After that, the lens 102 is driven and whether or not focusing is achieved is determined. When it is determined that no focusing is achieved, the lens 102 is driven again and distance measurement is performed.

After the focusing is surely achieved, main exposure starts.

After the exposure is completed, an image signal outputted from the solid state image pickup device 104 is A/D-converted by the A/D converter 106. The image signal passes through the signal processing unit 107 and is written into the memory unit 110 by the whole and arithmetic operation controlling unit 109.

Then, data stored in the memory unit 110 is recorded in the detachably attachable recording medium 112 such as a semiconductor memory through the interface unit (recording medium controlling I/F unit) 111 by the control of the whole and arithmetic operation controlling unit 109.

Alternatively, the data stored in the memory unit 110 may be directly inputted for image processing to a computer and the like through the interface unit (external I/F unit) 113.

Next, an example in the case where the solid state image pickup device according to each of the embodiments is applied to a video camera will be described.

Figure 9:
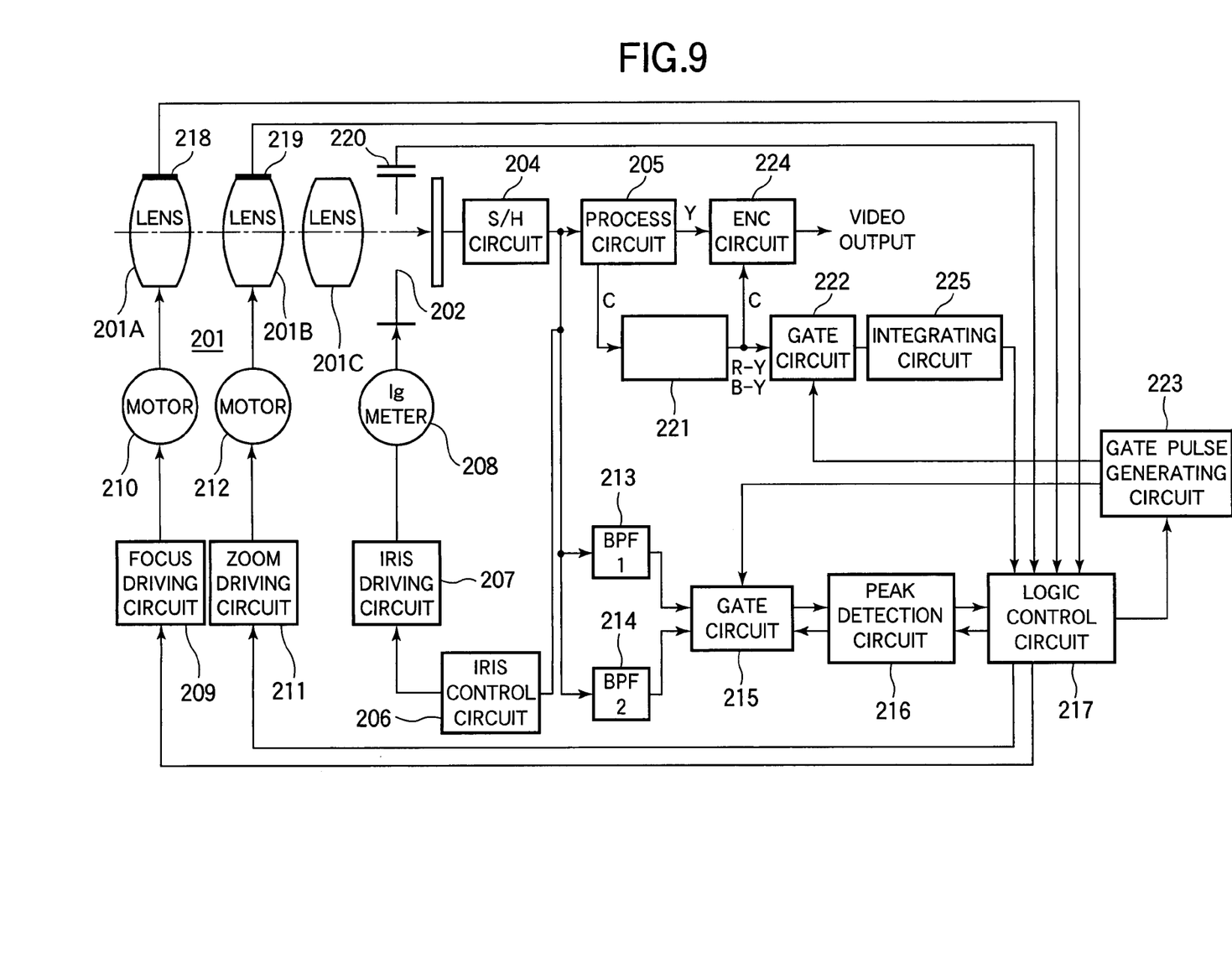
FIG. 9 is a block diagram showing an example in which the solid state image pickup device according to any embodiment of the present invention is applied to a video camera.

FIG. 9 is a block diagram showing an example in which the solid state image pickup device according to each of the embodiments is applied to a video camera. The video camera includes an image taking lens 201 which is composed of a focus lens 201A for focal adjustment, a zoom lens 201B for zoom operation, and an imaging lens 201C.

The video camera further includes a diaphragm 202, a solid state image pickup device 203 that converts a subject image formed on an image pickup surface into an electrical image pickup signal by photoelectric conversion, and a sample and hold circuit (S/H circuit) 204. The sample and hold circuit 204 samples and holds the image pickup signal outputted from the solid state image pickup device 203, amplifies a level of the image pickup signal, and outputs a video signal.

The video camera further includes a process circuit 205 that performs predetermined processings such as gamma correction, color separation, and blanking processing on the video signal outputted from the sample and hold circuit 204 and outputs a brightness signal Y and a chroma signal C. The chroma signal C outputted from the process circuit 205 is subjected to white balance correction and color balance correction by a color signal correction circuit 221 and color difference signals R-Y and B-Y are outputted from the color signal correction circuit 221.

The brightness signal Y outputted from the process circuit 205 and the color difference signals R-Y and B-Y outputted from the color signal correction circuit 221 are modulated by an encoder circuit (ENC circuit) 224 and outputted as a standard television signal from the encoder circuit 224. The standard television signal is supplied to a video recorder (not shown) or a monitor EVF such as an electronic view finder.

The video camera further includes an iris control circuit 206 that controls an iris driving circuit 207 based on the video signal supplied from the sample and hold circuit 204. An ig meter 208 is automatically controlled to control an opening size of the diaphragm 202 such that a level of the video signal becomes a predetermined level as a constant value.

The video camera further includes first and second band pass filters (BPFs) 213 and 214 that limit different bands to extract high frequency components necessary to detect whether or not the focusing is achieved from the video signal supplied from the sample and hold circuit 204. A signal outputted from the first band pass filter 213 (BPF1) and a signal outputted from the second band pass filter 214 (BPF2) each is subjected to gate processing in response to a focus gate frame signal by a gate circuit 215. A peak value of each of those signals is detected and held by a peak detection circuit 216 and inputted to a logic control circuit 217.

A signal indicating the peak value is called a focal voltage. The focusing is achieved based on the focal voltage.

The video camera further includes a focus encoder 218 that detects a movement position of the focus lens 201A, a zoom encoder 219 that detects a focal distance of the zoom lens 201B, and an iris encoder 220 that detects an opening size of the diaphragm 202. Detection values of those encoders are supplied to the logic control circuit 217 for system control.

The logic control circuit 217 detects whether or not focusing on a subject is achieved for focal adjustment based on a corresponding video signal within a set focusing detection region. That is, the peak value information of the high frequency components which are supplied from the respective band pass filters 213 and 214 are taken. In order to move the focus lens 201A to a position where the peak value of the high frequency component becomes maximum, control signals related to the rotational direction, rotational speed, start/stop, and the like of a focus motor 210 are supplied to the focus driving circuit 209, thereby controlling the focus motor 210.

Any of the above-mentioned embodiments is merely a specific example to embody the present invention and thus a technical scope of the present invention is not restrictively interpreted by those examples. That is, the present invention can be embodied in various forms without departing from technical ideas or essential features thereof.

This application claims priority from Japanese Patent Applications No. 2003-408030 filed Dec. 5, 2003 and No. 2004-287569 filed Sep. 30, 2004, which are hereby incorporated by reference herein.

What is claimed is:

1. A solid state image pickup device, comprising:
   an arrangement of a plurality of pixels, each pixel of which includes
      a photo diode configured to accumulate a signal charge generated by incident light,
      an amplification transistor whose control electrode receives the signal charge from the photo diode, the amplification transistor being configured to output an amplification signal corresponding to the signal charge to a signal output line,
      a reset transistor configured to reset the control electrode of the amplification transistor, and
      a transfer transistor configured to transfer the signal charge accumulated in the photo diode to the control electrode of the amplification transistor;
   a control transistor configured to switch a connection between the signal output line and a power source terminal configured to supply a potential to the signal output line; and
   a constant current transistor provided on the signal output line, such that the constant current transistor and the amplification transistor form a source follower,
   wherein the potential supplied by the power source terminal is of a polarity opposite to a polarity of a potential of a control terminal of the amplification transistor when outputting the amplification signal after a resetting of the control electrode of the amplification transistor, and
   wherein, during a first period in which the control transistor is turned on, the transfer transistor is turned on after the resetting of the control terminal of the amplification transistor.

2. A solid state image pickup device according to claim 1, further comprising:

potential supply means for selectively supplying different potentials to a power supply terminal of the amplification transistor, wherein the potential supply means supplies the power supply terminal with different potentials respectively during the first period and a second period in which a source follower is formed and the reset transistor is turned on, and wherein a potential supplied to the power supply terminal during the first period has a polarity opposite to a polarity of a potential supplied to the power supply terminal during the second period.

3. A solid state image pickup device according to claim 2, wherein the potential supply means includes a first transistor having a drain connected to the power supply terminal and a source connected to a first power source terminal, and a second transistor having a drain connected to a second power source terminal, for supplying a potential different from a potential supplied by the first power source terminal, and a source connected to the power supply terminal, wherein gates of the first and second transistors are commonly connected to a control line, and wherein the potential supplied by the first power source terminal has a polarity opposite to a polarity of the control electrode of the amplification transistor when outputting the amplification signal from the potential supplied by the second power source terminal.

4. A solid state image pickup device comprising:

an arrangement of a plurality of pixels, each pixel of which includes a photo diode configured to accumulate a signal charge generated by incident light, an amplification transistor whose control electrode receives the signal charge from the photo diode, the amplification transistor being configured to output an amplification signal corresponding to the signal charge to a signal output line, a reset transistor configured to reset the control electrode of the amplification transistor, and a transfer transistor configured to transfer the signal charge accumulated in the photo diode to the control electrode of the amplification transistor; and potential supply means for selectively supplying different potentials to a power supply terminal of the amplification transistor, wherein the potential supply means supplies the power supply terminal with different potentials after a resetting of the control terminal of the amplification transistor during a period in which a source follower is formed until the source follower is no longer formed, during a first period in which the transfer transistor is turned on and the control transistor is turned on, and during a second period in which the source follower is formed and the reset transistor is turned on, and wherein the potential supplied to the power supply terminal during the first period has a polarity opposite to a polarity of a potential supplied to the power supply terminal during the second period.

5. A method for driving a solid state image pickup device, comprising:

providing an arrangement of a plurality of pixels, each pixel of which:

accumulates, using a photo diode, a signal charge generated by incident light, receives, using a control electrode of an amplification transistor, the signal charge from the photo diode, outputs, using the amplification transistor, an amplification signal corresponding to the signal charge to a signal output line, resets, using a reset transistor, the control electrode of the amplification transistor, and transfers, using a transfer transistor, the signal charge accumulated in the photo diode to the control electrode of the amplification transistor;

switching, using a control transistor, a connection between the signal output line and a power source terminal for supplying a potential to the signal output line; and providing a constant current transistor on the signal output line, such that the constant current transistor and the amplification transistor form a source follower, wherein the potential supplied by the power source terminal is of a polarity opposite to a polarity of a potential of a control terminal of the amplification transistor when outputting the amplification signal after a resetting of the control electrode of the amplification transistor, and wherein, during a first period in which the control transistor is turned on, the transfer transistor is turned on after the resetting of the control terminal of the amplification transistor.

6. A method for driving a solid state image pickup device, comprising:

providing an arrangement of a plurality of pixels, each pixel of which:

accumulates, using a photo diode, a signal charge generated by incident light, receives, using a control electrode of an amplification transistor, the signal charge from the photo diode, outputs, using the amplification transistor, an amplification signal corresponding to the signal charge to a signal output line, resets, using a reset transistor, the control electrode of the amplification transistor, and transfers, using a transfer transistor, the signal charge accumulated in the photo diode to the control electrode of the amplification transistor; and selectively supplying, using potential supply means, different potentials to a power supply terminal of the amplification transistor, wherein the potential supply means supplies the power supply terminal with different potentials after a resetting of the control terminal of the amplification transistor during a period in which a source follower is formed until the source follower is no longer formed, during a first period in which the transfer transistor is turned on and the control transistor is turned on, and during a second period in which the source follower is formed and the reset transistor is turned on, and wherein the potential supplied to the power supply terminal during the first period has a polarity opposite to a polarity of a potential supplied to the power supply terminal during the second period.

* * * * *